US011832398B2

(12) United States Patent
Cosentino

(10) Patent No.: US 11,832,398 B2
(45) Date of Patent: Nov. 28, 2023

(54) APPARATUS AND METHOD FOR ENCAPSULATING AN ELECTRONIC COMPONENT

(71) Applicant: AcLeap Power Inc., Taipei (TW)

(72) Inventor: Evan Cosentino, Richardson, TX (US)

(73) Assignee: AcLeap Power Inc., Taipei (TW)

( * ) Notice: Subject to any disclaimer, the term of this patent is extended or adjusted under 35 U.S.C. 154(b) by 0 days.

(21) Appl. No.: 17/500,590

(22) Filed: Oct. 13, 2021

(65) Prior Publication Data

US 2023/0115061 A1    Apr. 13, 2023

(51) Int. Cl.
*H05K 5/00*    (2006.01)
*H05K 3/38*    (2006.01)
*H05K 7/20*    (2006.01)
*H05K 1/18*    (2006.01)

(52) U.S. Cl.
CPC ............. *H05K 5/003* (2013.01); *H05K 1/185* (2013.01); *H05K 3/386* (2013.01); *H05K 7/20509* (2013.01)

(58) Field of Classification Search
CPC .... H05K 7/20509; H05K 5/003; H05K 5/386; H05K 1/185; H05K 3/386
See application file for complete search history.

(56) References Cited

U.S. PATENT DOCUMENTS

| 5,226,220 A * | 7/1993 | Gevas | H01F 41/005 |
| | | | 29/605 |
| 7,825,762 B2 * | 11/2010 | Arai | H01F 27/022 |
| | | | 336/96 |
| 8,203,410 B2 * | 6/2012 | Sundstrom | H01F 27/04 |
| | | | 336/229 |
| 10,804,023 B2 * | 10/2020 | Pal | H01F 41/04 |

FOREIGN PATENT DOCUMENTS

CN         204442171 U  *  7/2015  ............. H02M 3/00

OTHER PUBLICATIONS

CN 204442171 U (Year: 2015).*
ABB, Inc., "Dual Shelf for the CC12500/ CH12500 Rectifier," product brochure, 12 pp. (May 8, 2019).

* cited by examiner

*Primary Examiner* — Mukundbhai G Patel
(74) *Attorney, Agent, or Firm* — Armstrong Teasdale LLP

(57) ABSTRACT

An apparatus for encapsulating at least one electronic component disposed on a printed circuit board may include a liquid-tight enclosure that surrounds the electronic component and that is fixed with respect to the electronic component and the circuit board, and an encapsulating material disposed inside the enclosure and encapsulating the electronic component. The enclosure may include at least one sidewall and a top. The at least one sidewall may include a rigid material, a lower edge that is proximal to the printed circuit board, an upper edge that is distal from the circuit board, and a height above the circuit board that is no more than 0.003 inches greater than a height of the electronic component above the circuit board. The top may include a solid surface disposed on the upper edge of the at least one sidewall, where the at least one sidewall and the top form the enclosure.

18 Claims, 4 Drawing Sheets

APPARATUS AND METHOD FOR
ENCAPSULATING AN ELECTRONIC
COMPONENT

BACKGROUND

Components in an electronic circuit, for example, a power conversion circuit, may need to be cooled to function or to function properly. One method of cooling is forced convection, where a component of an electronic circuit may be adequately cooled by placing the component in an airflow such as an airflow produced by a fan, a blower, or the like.

Another method of cooling is conduction cooling. Conduction cooling may be used in power conversion to allow higher power density and better energy efficiency of a power conversion circuit than possible with forced convection cooling. A conduction-cooled component may have at least some of the surfaces of the electronic component mechanically coupled to a heat removal apparatus (i.e., a heat sink or a heat exchanger) in order to be cooled.

Some electronic components, for example, magnetic devices, may be sensitive to deformation of windings, cracking of cores, abrasion of insulation, and the like, and/or may be irregular in shape and may require different handling from other electronic components in order to cool them using traditional conduction cooling. For example, magnetic devices may be hand-wound, resulting in inconsistent geometry. Further, magnetic devices may require large encapsulation enclosures for cold plate applications. These enclosures may perform poorly and be expensive.

BRIEF SUMMARY

One or more embodiments of the present invention may provide an apparatus for encapsulating at least one electronic component disposed on a printed circuit board. The apparatus may include a liquid-tight enclosure that surrounds the at least one electronic component and that is fixed with respect to the at least one electronic component and the printed circuit board, and an encapsulating material disposed inside the liquid-tight enclosure and encapsulating the at least one electronic component. The liquid-tight enclosure may include at least one sidewall and a top. The at least one sidewall may include a rigid material and may further include a lower edge that is proximal to the printed circuit board, an upper edge that is distal from the printed circuit board, and a height above the printed circuit board that is no more than 0.003 inches greater than a height of the at least one electronic component above the printed circuit board. The top may include a solid surface disposed on the upper edge of the at least one sidewall, where the at least one sidewall and the top form the liquid-tight enclosure.

One or more embodiments of the present invention may provide a method for encapsulating at least one electronic component disposed on a printed circuit board. The method may include surrounding the at least one electronic component with a liquid-tight enclosure, fixing the enclosure with respect to the at least one electronic component and the printed circuit board, and encapsulating the at least one electronic component in the liquid-tight enclosure with an encapsulating material. The liquid-tight enclosure may include at least one sidewall. The at least one sidewall may include a rigid material and may further include a lower edge that is proximal to the printed circuit board and an upper edge that is distal from the printed circuit board. The liquid-tight enclosure may further include a top. The top may include a solid surface disposed on the upper edge of the at least one sidewall, where the at least one sidewall and the top form the liquid-tight enclosure.

One or more embodiments of the present invention may provide a system for cooling at least one electronic component disposed on a printed circuit board. The system may include a liquid-tight enclosure disposed around the at least one electronic component. The liquid-tight enclosure may include at least one sidewall, a top, and an encapsulating material that fills the enclosure. The at least one sidewall may include a rigid material, and may further include a lower edge that is proximal to the printed circuit board and an upper edge that is distal from the printed circuit board. The top may include a solid surface disposed on the upper edge of the at least one sidewall. The at least one sidewall and the top may form the liquid-tight enclosure. The system may further include a cold plate disposed on the top of the liquid-tight enclosure.

DETAILED DESCRIPTION

Figure 1:
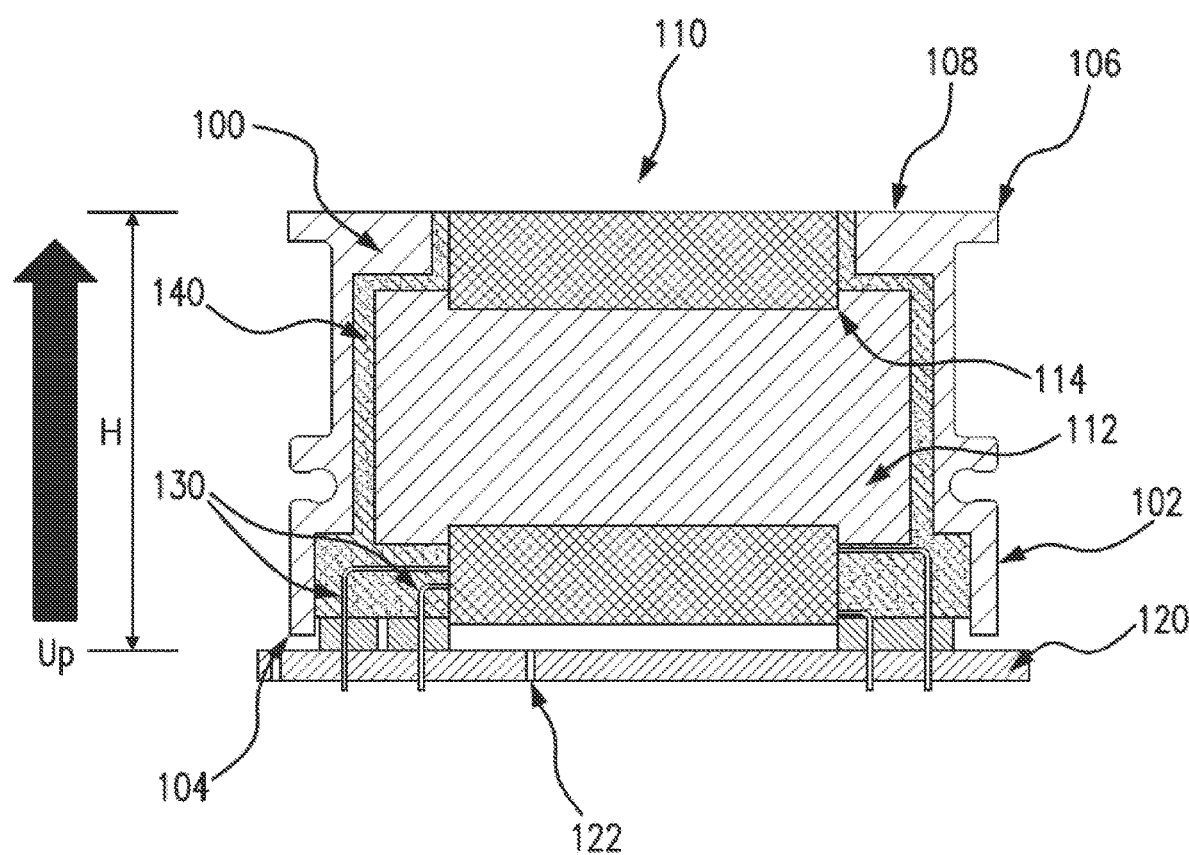
FIG. 1 shows a cross-section of an encapsulation of a magnetic device in an enclosure in accordance with one or more embodiments.

One or more embodiments of the present invention may provide an apparatus to enclose and encapsulate one or more magnetic devices (and/or other electronic devices), where the enclosure for retaining the encapsulation may be reduced in size, and the efficiency of heat dissipation may be increased. While the present disclosure may refer to encapsulation of magnetic devices, it will be clear that other electronic devices may be similarly encapsulated.

The apparatus may include or couple to a cold plate. A cold plate is an example of a heat removal apparatus that uses a fluid (for example, a liquid or a gas) flowing through the plate to provide conduction cooling of a magnetic device or other electronic device. The cold plate may be a metal plate. Possible metals include aluminum, copper, steel, iron, and the like. A cold plate may have one inlet and one outlet for the fluid, although multiple inlets and/or outlets may be used.

A magnetic device may be defined as a passive element that relies on an internal magnetic field to alter electrical current. Examples of a magnetic device may include an inductor, a transformer, a choke, and the like. Examples of other electronic devices that may be encapsulated in an enclosure may include transistors, for instance field effect transistors (FETs), resistors, capacitors, diodes, and the like.

Cooling a magnetic device may be a challenge for both forced convection and conduction cooling. A magnetic device may have a large, bulky package and may generate significant amounts of heat. A magnetic device may include a significant portion of electrically insulating material between its highly conductive windings. This electrically insulating material may add significant thermal resistance to the magnetic device, reducing the rate of heat dissipation. A magnetic device may have a large core as well. The core may be made of ferrite or a similar material. The core may generate heat but may conduct heat poorly. For example, ferrite has a thermal conductivity of about 4 watts/meter-kelvin (W/mK). In addition to their inherent structural challenges, both a magnetic device's electrical windings and core may be very delicate as described above. Thus, ensuring contact of a magnetic device to a cold plate using a mechanical force (for example, by clamping) may not be possible. All of these factors have led the use of an encapsulation (or potting) process, where the magnetic device is submerged in a resin or epoxy that then cures and allows heat to be transferred through conduction on all external surfaces. This also allows virtually no pressure to be applied to the magnetic device, making it a safe method of cooling. Encapsulating materials may include silicone resin or epoxy among others.

Encapsulation comes at a cost, especially when evaluating scale of cost versus thermal resistance. Inexpensive encapsulating materials may have a thermal conductivity of less than 1 W/m·K, which is more than an order of magnitude less than the thermal conductivity of any metallic material, for example a metallic material used to enclose an electronic device. Possible encapsulating materials with three times the thermal conductivity of inexpensive encapsulating materials are also typically more than three times the cost. Thus, in optimizing a mechanical design for encapsulating a magnetic device in an enclosure, it may be more advantageous to select an encapsulating material with a higher thermal conductivity (that is, lower thermal resistance). However, even when using a less expensive encapsulating material, a liberal use of that material may drive significant cost. Therefore, a more effective encapsulation solution may be one that can utilize a minimal amount of the encapsulating material.

In order to encapsulate a magnetic device (or other electronic device), the enclosure must not only be liquid tight in order to contain the encapsulating material until the material is cured but must also allow adequate room for the encapsulating material to flow. These requirements may add significant amounts of space and material needed for a cooling solution. This may be particularly true when encapsulation is used for only a small number of devices on the printed circuit board. When all components on a printed circuit board are to be encapsulated, magnetic devices and other power components may be selected and designed to be the correct height with the enclosure in mind. However, when only a select number of devices are encapsulated, the entire design must shift to accommodate the enclosure dimensions. For example, if every component is one inch tall and is pressed against a cold plate, encapsulating a single component would require a new design where every other device must increase in height to match the new enclosure's height in order to maintain contact with the cold plate. This may add significant cost and complexity to a design. One or more embodiments of the present disclosure may eliminate this issue, while improving general enclosure design and function. Enclosures may have various shapes to meet various needs, constraints, and choices. The shape may be regular or irregular. An enclosure traversed by a plane parallel to the printed circuit board to which a magnetic device may be attached may appear circular, elliptical, oval, square, rectangular, or other multilateral shape as the enclosure intersects the plane. Further, the shape may change as a function of the position of the plane relative to the printed circuit board. That is, the cross-section of the enclosure may not be the same at all distances from the printed circuit board.

One or more embodiments of the present disclosure may provide a method to encapsulate a magnetic device. The method may reduce the clearance required above the magnetic device to perform the encapsulation, maintain electrical insulation, and decrease thermal resistance.

Referring to FIG. 1 as an example of one or more embodiments of the present disclosure, a liquid-tight enclosure 100 may surround a magnetic device 110 or other electronic device. The enclosure 100 may be a shaped metal enclosure that extends around the sides and the top of the magnetic device 110 or other electronic component. The magnetic device 110 may include a core 112 and/or conductive windings 114. The core 112 may include ferrite or other material with appropriate magnetic characteristics. The windings 114 may include electrically insulating material between the windings 114. The magnetic device 110 may be disposed on a printed circuit board (PCB) 120 and electrical leads 130 may electrically couple the magnetic device 110 to the printed circuit board 120. As an example, electronic components, including one or more magnetic devices 110, may be mounted on a PCB 120 to form a rectifier. The enclosure 100 may include at least one sidewall 102 with a lower edge 104 proximal to the printed circuit board 120 and an upper edge 106 distal from the printed circuit board 120. The at least one sidewall 102 may include a rigid material such as metal, plastic, or some similar material. The at least one sidewall 102 may include a combination of rigid materials. The rigid materials may be selected based on properties including thermal conductivity and rigidity as a function of temperature among others. Metals for the at least one sidewall 102 may include copper, aluminum, and steel among others. The enclosure 100 may also include a top 108 that includes a solid surface disposed on the upper edge 106 of each sidewall. The solid surface may include a flexible film such as a polyimide film or tape. The top 108 may include a cold plate. The top 108 may be fastened to the at least one sidewall 102 by suitable means such as the adhesive of a tape, a thermally conductive grease, a thermal gap pad, or a gap filler. A thermal gap pad is a soft, conformable thermal pads that may provide effective thermal interfaces between heat sinks and electronic devices, accommodating for uneven surfaces, air gaps, and rough surface textures. Some thermally conductive grease, gap pads, and gap fillers may include silicone. In one or more embodiments, the top may include only the solid surface. For example, the solid surface may be a flexible film that spans between upper edges 106 of the at least one sidewall 102.

The space between the magnetic device 110 and the enclosure 100 may be filled with encapsulating material 140 such as silicone. The amount of space between the magnetic device 110 and the enclosure 100 may depend on the ability of the encapsulating material 140 to electrically insulate the magnetic device 110. In one or more embodiments, the encapsulating material 140 does not extend over all or part of the top 108 of the magnetic device 110, where the top 108 of the magnetic device 110 is understood to be the surface of the magnetic device 110 farthest from the printed circuit board 120. With no encapsulating material 140 above all or part of the top 108 of the magnetic device 110, the ability to transfer heat from the magnetic device 110 to a cold plate may be enhanced.

In one or more embodiments, the height H of the at least one sidewall 102 above the printed circuit board may be no more than 0.003 inches (0.00762 centimeters (cm)) greater than a height of the at least one magnetic device (or other electronic component) above the printed circuit board 120. For example, the top 108 may be formed using a film or tape such as polyimide film or tape. This film or tape may span between the upper edges 106 of the at least one sidewall 102. In one or more embodiments, the height H of the at least one sidewall 102 above the printed circuit board 120 may be less than or equal to the height of the at least one magnetic device 110 above the printed circuit board 120.

The solid surface may be disposed directly on one or more magnetic devices 110 in the enclosure 100. For example, a flexible film or a surface of a cold plate may be disposed directly on a transformer. In one or more embodiments, the solid surface may be removed after the encapsulating material 140 has cured. This removal may allow the one or more magnetic devices 110 direct contact with or very close proximity to a cold plate. In some cases, a thermally conductive grease, gasket, gap pad, or gap filler may be placed between a magnetic device 110 and a cold plate.

In one or more embodiments, the enclosure 100 may be formed by a single extrusion, or the single extrusion may split into two or more separate extrusions, perhaps symmetrical. The sidewalls 102 may be created such that the maximum height is equal to the maximum height of the magnetic device 110 or other electronic component. These sidewalls 102 may extend inwards towards the magnetic device 110 only as far as permitted by clearance requirements, and the sidewalls 102 may follow the curve of the magnetic device 110 where possible until no longer feasible. A layer of polyimide tape may be placed on top of the enclosure 100 such that the tape extends over the gap in the top surface. The tape may be attached to the sidewalls 102 and rest upon the peak of the magnetic device 110. The enclosure 100 may then be encapsulated by inverting the assembly with the top surface (tape side) of the enclosure 100 being placed on top of a flat plate, perhaps of metal. The encapsulating material 140 may be poured or injected and allowed to cure, at which point the flat plate may be removed. For example, the entire assembly shown in FIG. 1 may be inverted and the encapsulating material 140 may be introduced through one or more holes 122 in the printed circuit board 120. The finished assembly may then resemble FIG. 1 when turned upright, and may be further coupled to the cold plate from above.

One or more embodiments of the present disclosure may reduce the height and volume of a liquid-tight enclosure 100 and the encapsulating material 140 as well as reducing the thermal resistance between the magnetic device 110 and the cold plate. By reducing the size of the enclosure 100 and the amount of encapsulating material 140 required, reductions in cost may also be realized.

This design may eliminate the top portion of the enclosure and the associated potting material. This may allow the at least one sidewall of the enclosure to be the same height as (or lower than) the electronic component, so the only height required above the electronic component may be the thickness of a layer of tape, which at 0.003 inches ($7.62 \times 10^{-5}$ meters (m)) thick may be thinner than a standard manufacturing tolerance. A tape, for example, a polyimide tape, may be able to contact the magnetic device due to the electrically insulating properties of the tape.

Figure 2:
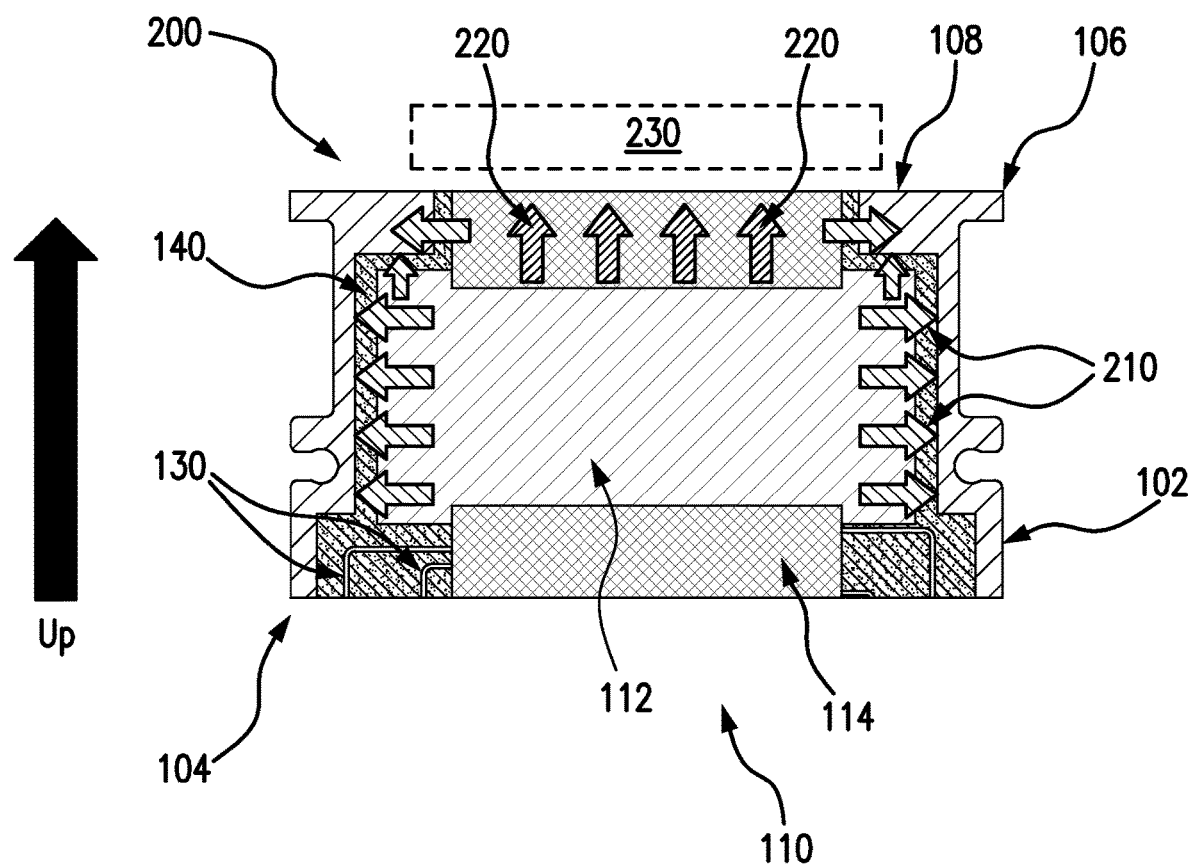
FIG. 2 shows heat transfer paths for the encapsulation of FIG. 1 in accordance with one or more embodiments.

Additionally, one or more embodiments of the present disclosure may feature decreased thermal resistance compared to other apparatuses. Referring to FIG. 2, one sees an apparatus with features presented in the example from FIG. 1. In addition, two modes of heat conduction from the magnetic device 110 to outside the enclosure 200 are represented by two different types of arrows. A first mode 210 shows heat conducted through encapsulating material 140 and the enclosure 200 before reaching outside. In this mode 210, the total thermal resistance would be the sum of the thermal resistance through the encapsulating material 140 plus the thermal resistance through the enclosure 200. A second mode 220 shows heat conduction directly from the magnetic device 110 to the outside, perhaps to a cold plate 230. The thermal resistance in this second mode 220 would be simply that produced by the top 108 of the enclosure 200, such as a film or tape, or reduced to only contact resistance (present in other modes as well) if the magnetic device 110 makes direct contact with a cold plate 230 or other heat removal apparatus.

Figure 3:
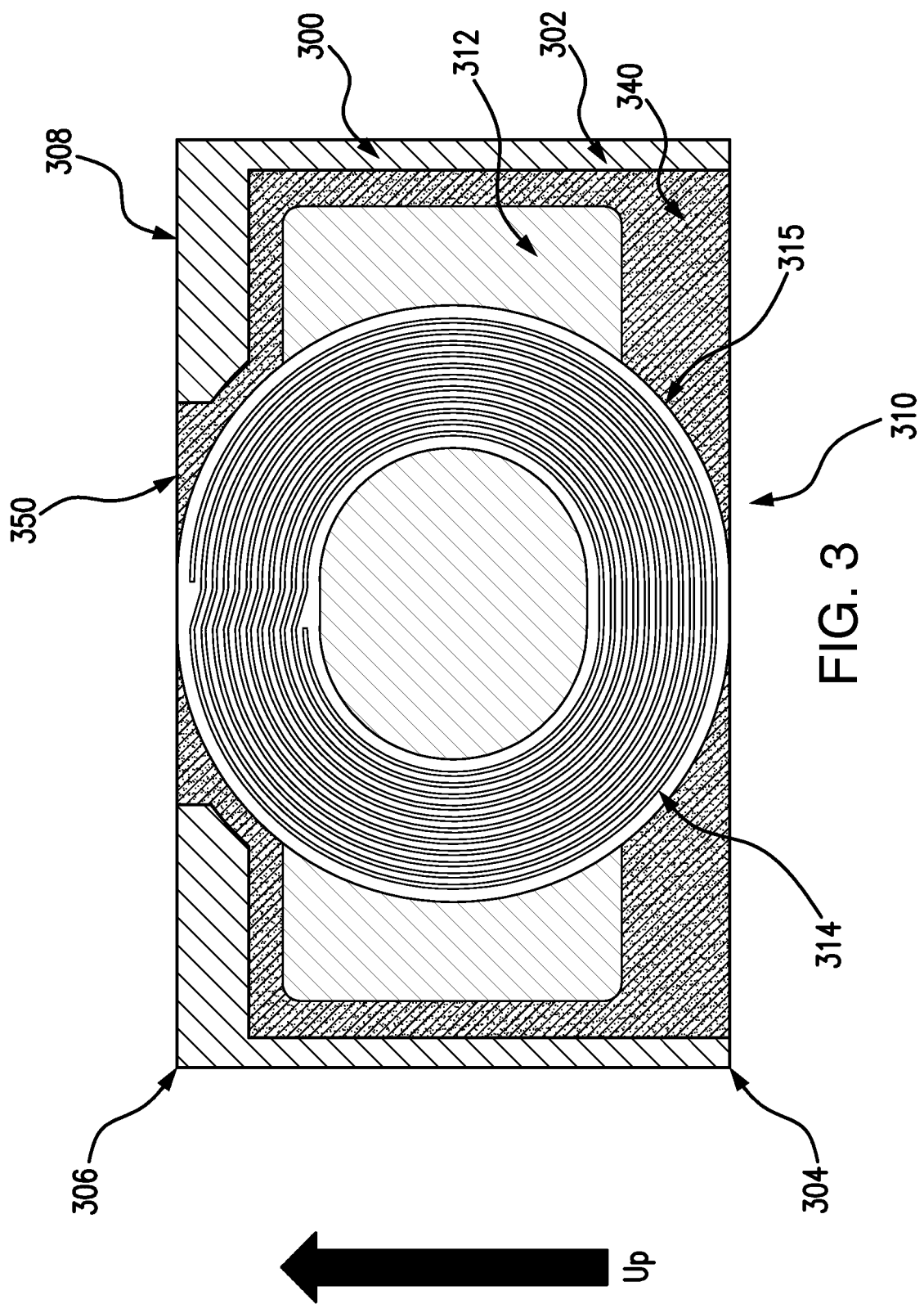
FIG. 3 shows a cross-section of another encapsulation of a magnetic device in an enclosure in accordance with one or more embodiments.

Referring to FIG. 3, in one or more embodiments of the present disclosure, an enclosure 300 is disposed around a magnetic device 310. The magnetic device 310 may include a core 312 and windings 314. The windings 314 may be electrically insulated from each other and from their surroundings by winding insulation 315. The enclosure 300 may have at least one sidewall 302 with a lower edge 304 and an upper edge 306. The top 308 of the enclosure 300 may include one or more rigid materials. For example, the top 308 may be partially made of the same material as the at least one sidewall 302 while the portion of the top 308 closer to the magnetic device 310 may include a film 350 or tape such as polyimide film or tape, though other materials may be used. Between the enclosure 300 and the magnetic device 310 may be encapsulating material 340. The encapsulating material 340 may be a liquid that flows into the space between the enclosure 300 and the magnetic device and then cures to form a solid. In one or more embodiments, after the encapsulating material 340 is cured, the film 350 or tape may be removed.

One or more embodiments of the present disclosure may provide a method to encapsulate one or more magnetic devices (and/or other electronic devices), where an enclosure for retaining the encapsulation may be reduced in size, and the efficiency of heat dissipation may be increased.

Figure 4:
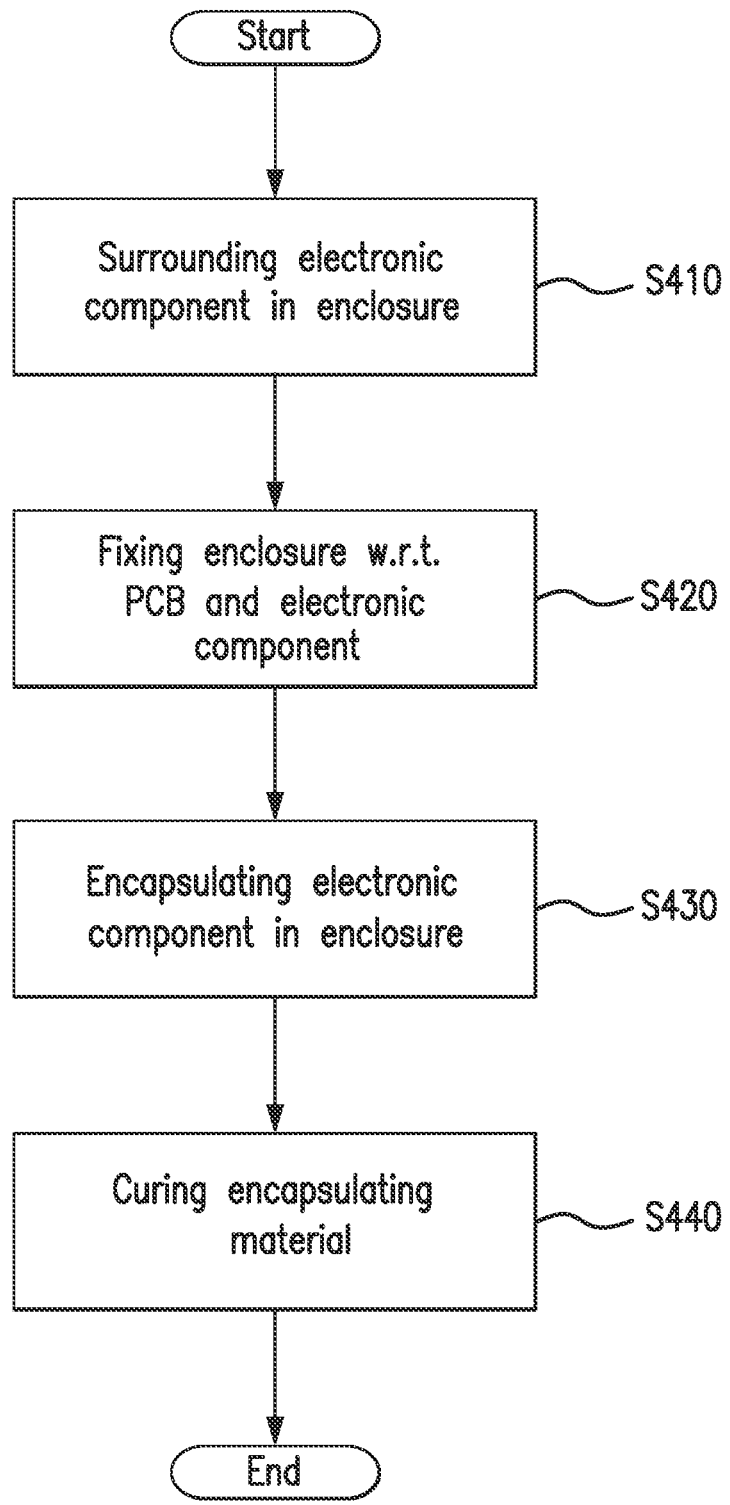
FIG. 4 shows a flow chart of a method for encapsulating of a magnetic device in an enclosure in accordance with one or more embodiments.

Referring to FIG. 4, a method for encapsulating at least one electronic component disposed on a printed circuit board may include surrounding the at least one electronic component with a liquid-tight enclosure S410. The enclosure may include at least one sidewall that may include a rigid material. The at least one sidewall may further include a lower edge that may be proximal to the printed circuit board and an upper edge that may be distal from the printed circuit board. The enclosure may further include a top that may include a solid surface that may be disposed on the upper edge of each sidewall of the at least one sidewall. The at least one sidewall and the top may form the liquid-tight enclosure.

The method may further include fixing the enclosure with respect to the at least one electronic component and the printed circuit board S420. The enclosure and the at least one electronic component may be fixed to the printed circuit board as one possible means of achieving the fixing.

The method may also include encapsulating the at least one electronic component in the enclosure with an encapsulating material in fluid form S430 and curing the encapsulating material S440.

In one or more embodiments, the method may include inverting the printed circuit board, the at least one electronic component, the sidewall, and the top as one before encapsulating.

The printed circuit board may have one or more holes 122 as shown in FIG. 1. In one or more embodiments, the encapsulating may include injecting or pouring liquid encapsulating material 140 through the at least one hole 122 in the printed circuit board 120 in order to flow into any space between the enclosure and the at least one electronic device.

In one or more embodiments, the solid surface may be a flexible film and the method may include supporting the flexible film with a rigid surface during the encapsulating and the curing.

The method may further include removing the rigid surface after the curing is complete.

In one or more embodiments, the method may further include removing the flexible film after the curing is complete. Removing the flexible tape may allow the magnetic device or other electronic component to make direct contact with a cold plate or other heat removal device.

In one or more embodiments, the solid surface may include a cold plate that may remove heat generated by the at least one electronic component.

In one or more embodiments, a height of the at least one sidewall above the printed circuit board may be no more than 0.003 inches greater than a height of the at least one electronic component above the printed circuit board. In one or more embodiments, the height of the at least one sidewall above the printed circuit board may less than or equal to the height of the at least one electronic component above the printed circuit board. Further, the height of the at least one sidewall above the printed circuit board may be less than the height of the at least one electronic component above the printed circuit board.

According to one or more embodiments of the method, the solid surface may be disposed directly on the at least one magnetic device. The solid surface may be a surface of a cold plate.

One or more embodiments of the present disclosure may be a system for cooling at least one electronic component disposed on a printed circuit board. The system may include a liquid-tight enclosure disposed around the at least one electronic component and a cold plate. The enclosure may include at least one sidewall that includes a rigid material. The sidewall may also include a lower edge that is proximal to the printed circuit board and an upper edge that is distal from the printed circuit board. The enclosure may further include a top and an encapsulating material that fills the enclosure. The top may include a solid surface disposed on the upper edge of each sidewall of the at least one sidewall. The at least one sidewall and the top may form the liquid-tight enclosure, and the cold plate may be disposed on the top of the liquid-tight enclosure.

One or more embodiments of the present disclosure may eliminate the need for clearance space above components that require encapsulation while maintaining a safe and simple design. Independently from this benefit of zero clearance above the encapsulated component, this enclosure may offer improvement in thermal performance when using low cost materials.

In the present disclosure, height refers to the distance away from the upper surface of a printed circuit board. More specifically, the height of a component, enclosure, part or portion of a component or an enclosure, and the like, is understood to be the greatest distance of that component, enclosure, part, or the like from the upper surface of a printed circuit board.

While the present disclosure has primarily addressed encapsulation of magnetic devices, it is to be understood that other types of electronic devices may be similarly encapsulated. Examples presented above are for illustration purposes and are not intended in any way to limit the scope of the present disclosure.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An apparatus for encapsulating at least one electronic component disposed on a printed circuit board, the apparatus comprising:
a liquid-tight enclosure that surrounds the at least one electronic component, wherein the liquid-tight enclosure is fixed with respect to the at least one electronic component and the printed circuit board, and wherein the liquid-tight enclosure is in fluid communication with at least one hole extending through the printed circuit board, the liquid-tight enclosure comprising:
at least one sidewall comprising a rigid material, the at least one sidewall further comprising:
a lower edge that is proximal to the printed circuit board;

an upper edge that is distal from the printed circuit board; and a height above the printed circuit board that is no more than 0.003 inches greater than a height of the at least one electronic component above the printed circuit board;

a top comprising a solid surface disposed on the upper edge of the at least one sidewall, wherein the at least one sidewall and the top form the liquid-tight enclosure; and an encapsulating material that extends from the at least one hole and fills the liquid-tight enclosure to encapsulate the at least one electronic component.

2. The apparatus of claim 1, wherein the at least one electronic component comprises at least one magnetic device.

3. The apparatus of claim 1, wherein the solid surface comprises a flexible film.

4. The apparatus of claim 3, wherein the flexible film comprises a polyimide film or an adhesive polyimide tape.

5. The apparatus of claim 1 wherein the height of the at least one sidewall above the printed circuit board is less than or equal to the height of the at least one electronic component above the printed circuit board.

6. The apparatus of claim 5 wherein the height of the at least one sidewall above the printed circuit board is less than the height of the at least one electronic component above the printed circuit board.

7. The apparatus of claim 1 wherein the solid surface is disposed directly on the at least one electronic component.

8. The apparatus of claim 1 wherein the solid surface is a surface of a cold plate.

9. A method for encapsulating at least one electronic component disposed on a printed circuit board, the method comprising:

surrounding the at least one electronic component with a liquid-tight enclosure, the liquid-tight enclosure comprising:

at least one sidewall comprising a rigid material, the at least one sidewall further comprising:

a lower edge that is proximal to the printed circuit board; and an upper edge that is distal from the printed circuit board; and a top comprising a solid surface disposed on the upper edge of the at least one sidewall, wherein the at least one sidewall and the top form the liquid-tight enclosure, and wherein a height of the at least one sidewall above the printed circuit board is no more than 0.003 inches greater than a height of the at least one electronic component above the printed circuit board;

fixing the liquid-tight enclosure with respect to the at least one electronic component and the printed circuit board, wherein fixing the liquid-tight enclosure places the liquid-tight enclosure in fluid communication with at least one hole extending through the printed circuit board; and encapsulating the at least one electronic component in the liquid-tight enclosure with an encapsulating material by injecting or pouring the encapsulating material through the at least one hole to fill the liquid-tight enclosure.

10. The method of claim 9, further comprising, after encapsulating, curing the encapsulating material.

11. The method of claim 10, wherein the solid surface comprises a flexible film.

12. The method of claim 11, further comprising supporting the flexible film with a rigid surface during the encapsulating and the curing.

13. The method of claim 12, further comprising removing the rigid surface after the curing is complete.

14. The method of claim 11, further comprising removing the flexible film after the curing is complete.

15. The method of claim 9, wherein the at least one electronic component comprises at least one magnetic device.

16. The method of claim 15 wherein the solid surface is disposed directly on the at least one magnetic device.

17. The method of claim 9, further comprising inverting the printed circuit board, the at least one electronic component, the sidewall, and the top as one before encapsulating the at least one electronic component.

18. A system for cooling at least one electronic component disposed on a printed circuit board, the system comprising:

a liquid-tight enclosure disposed around the at least one electronic component and fixed to the printed circuit board, the liquid-tight enclosure in fluid communication with at least one hole extending through the printed circuit board, the liquid-tight enclosure comprising:

at least one sidewall comprising a rigid material, the sidewall further comprising:

a lower edge that is proximal to the printed circuit board; and an upper edge that is distal from the printed circuit board, wherein a height of the at least one sidewall above the printed circuit board is no more than 0.003 inches greater than a height of the at least one electronic component above the printed circuit board;

a top comprising a solid surface disposed on the upper edge of the at least one sidewall; and an encapsulating material that extends from the at least one hole and fills the liquid-tight enclosure, wherein the at least one sidewall and the top form the liquid-tight enclosure; and a cold plate disposed on the top of the liquid-tight enclosure.

* * * * *